US009742108B2

(12) United States Patent
Matsuura

(10) Patent No.: US 9,742,108 B2
(45) Date of Patent: Aug. 22, 2017

(54) CONNECTOR

(71) Applicant: Sumitomo Wiring Systems, Ltd., Yokkaichi, Mie (JP)

(72) Inventor: Junya Matsuura, Mie (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 15/238,911

(22) Filed: Aug. 17, 2016

(65) Prior Publication Data

US 2017/0062977 A1    Mar. 2, 2017

(30) Foreign Application Priority Data

Aug. 28, 2015    (JP) ................................. 2015-168669

(51) Int. Cl.
| | |
|---|---|
| *H01R 13/627* | (2006.01) |
| *H01R 13/11* | (2006.01) |
| *H01L 23/00* | (2006.01) |
| *H01R 13/66* | (2006.01) |
| *H01R 103/00* | (2006.01) |

(52) U.S. Cl.
CPC ......... *H01R 13/6272* (2013.01); *H01L 24/40* (2013.01); *H01R 13/113* (2013.01); *H01R 13/6641* (2013.01); *H01R 2103/00* (2013.01)

(58) Field of Classification Search
CPC ............ H01R 13/6275; H01R 13/6273; H01R 13/6272
USPC .................................. 439/357, 353, 358, 354
See application file for complete search history.

(56) References Cited

U.S. PATENT DOCUMENTS

| | | | | |
|---|---|---|---|---|
| 6,074,234 A | * | 6/2000 | Hasegawa | .......... H01R 13/6273 439/353 |
| 8,129,836 B2 | * | 3/2012 | Takano | ............. H01L 23/49575 257/500 |
| 2002/0025713 A1 | * | 2/2002 | Tabata | ............... H01R 13/5812 439/367 |

FOREIGN PATENT DOCUMENTS

JP    2011-187302    9/2011

* cited by examiner

*Primary Examiner* — Phuongchi T Nguyen
(74) *Attorney, Agent, or Firm* — Gerald E. Hespos; Michael J. Porco; Matthew T. Hespos

(57) ABSTRACT

A connector is configured such that a fitting-side component (10) is fit into a receiving-side component (20). The fitting-side component (10) includes a block-shaped main body (11) and a lock (15) standing on an outer surface of the main body (11). The receiving-side component (20) includes a receptacle (21) open forward and externally fittable to the fitting-side component (10). A locking surface (16) is provided on a surface of the lock (15) facing an opening side of the receptacle (21) in a fitted state of the fitting-side component (10) and the receiving-side component (20). The locking surface (16) stands substantially at a right angle to a separating direction from the receiving-side component (20). The receiving-side component (20) includes a lock projection (35) projecting on an inner surface of the receptacle (21) for locking the locking surface 16 from the opening side of the receptacle (21).

7 Claims, 12 Drawing Sheets

CONNECTOR

BACKGROUND

1. Field of the Invention

The invention relates to a connector.

2. Description of the Related Art

Conventionally, there is known a connector configured such that a block-shaped fitting-side component is fit into a receiving-side component. The receiving-side component includes a receptacle externally fittable to the fitting-side component. For example, Japanese Unexamined Patent Publication No. 2011-187302 discloses a connector in which a block-shaped diode connector is fit in a connector housing. This connector includes a projecting portion that projects slightly out of the receptacle of the connector housing as a locking structure for holding the diode connector fit in the connector housing. The projecting portion has a vertical wall standing up outward from the receptacle and a horizontal wall projecting in a substantially perpendicular direction from the tip of the vertical wall. The projecting portion is provided on an opening end side of the receptacle and the projecting end of the horizontal wall is separated from the receptacle. On the other hand, a lock (not shown in Japanese Unexamined Patent Publication No. 2011-187302) lockable to the horizontal wall of the projecting portion from a back side of the receptacle when the diode connector is fit into the connector housing is provided on an outer surface of the diode connector. The lock of the diode connector is locked to the projecting portion of the receptacle to hold the diode connector in the housing.

Since the horizontal wall of the projecting portion is easily opened outwardly in the locking structure configured as described above, a locked state is easily released. This is because it is assumed that the locking structure is fixed by winding a tape around the outer peripheral surface thereof after the fitting-side component is fitted into the receiving-side component. Accordingly, it has been desired to enhance a holding force of the receiving-side component for holding the fitting-side component in order to eliminate the need for tape winding and reduce cost.

The present invention was completed based on the above situation and aims to allow a connector to have an improved overall operability.

SUMMARY

One aspect of the invention relates to a connector configured so that a fitting-side component can fit into a receiving-side component. The fitting-side component includes a block-shaped main body and at least one lock standing on an outer surface of the main body. The receiving-side component includes a receptacle that is open forward and can fit externally to the fitting-side component. A locking surface is provided on a surface of the lock facing an opening side of the receptacle in a fitted state of the fitting-side component and the receiving-side component. The locking surface projects at an angle, and preferably substantially at a right angle, to a separating direction from the receiving-side component. The receiving-side component includes at least one lock projection projecting on an inner surface of the receptacle for locking the locking surface from the opening side of the receptacle.

The receptacle may include a main body fitting portion shaped to substantially extend along outer surfaces of the main body and a lock receiving portion having one or more walls configured to extend the lock portion. The lock projection may project on an inner surface of the lock receiving portion.

The lock receiving portion may comprise two walls configured to extend substantially extend along outer surfaces of the lock and arranged to substantially face each other.

The receptacle may include a main body fitting portion shaped to extend along outer surfaces of the main body and a lock receiving portion having two walls configured to extend along outer surfaces of the lock and arranged to face each other. The lock projection may project on an inner surface of the lock receiving portion. The receptacle is shaped in conformity with the outer shape of the fitting-side component. Thus, the receiving-side component can have a compact shape.

The lock receiving portion may include a bridge that bridges between the two walls. An opening deformation of the walls is less likely with this configuration, a locked state of the locking surface and the lock receiving portion can be held more reliably.

The lock receiving portion may have an opening through which a jig can be inserted into an inner space of the receiving-side component and preferably between the two walls. Thus, the fitting-side component can be detached from the receiving-side component by inserting the jig between the walls through the opening and releasing locking between the lock and the lock projection.

The bridge may be configured so that the jig at least partly inserted through the opening is guided by the bridge into a space between the first and second walls, A surface of the lock projection substantially facing the opening side of the receptacle may have an inclined surface whose projecting distance gradually increases from the opening side toward a back side. The lock of the fitting-side component easily moves over the lock projection. Thus, an operation of fitting the fitting-side component into the receiving-side component can be performed easily.

The receiving-side component may include at least one reinforcing portion at least partly provided along an opening of the receptacle. Thus, the receptacle is difficult to deform, and the holding force of the receiving-side component for holding the fitting-side component in the fitting state can be enhanced.

The connector may have a built-in large-capacity chip diode and may be used to provide a rectifying action. More particularly, the fitting-side component may comprise the chip diode.

Since the lock projection is difficult to displace, a locked state of the lock projection and the locking surface is not easily released. Thus, a holding force of the receiving-side component for holding the fitting-side component in the fitted state can be enhanced and overall operability can be improved.

These and other features and advantages of the invention will become more apparent upon reading the following detailed description of preferred embodiments and accompanying drawings. It should be understood that even though embodiments are described separately, single features thereof may be combined to additional embodiments.

DETAILED DESCRIPTION

Hereinafter, one specific embodiment of the invention is described in detail with reference to FIGS. 1 to 13.

Figure 1:
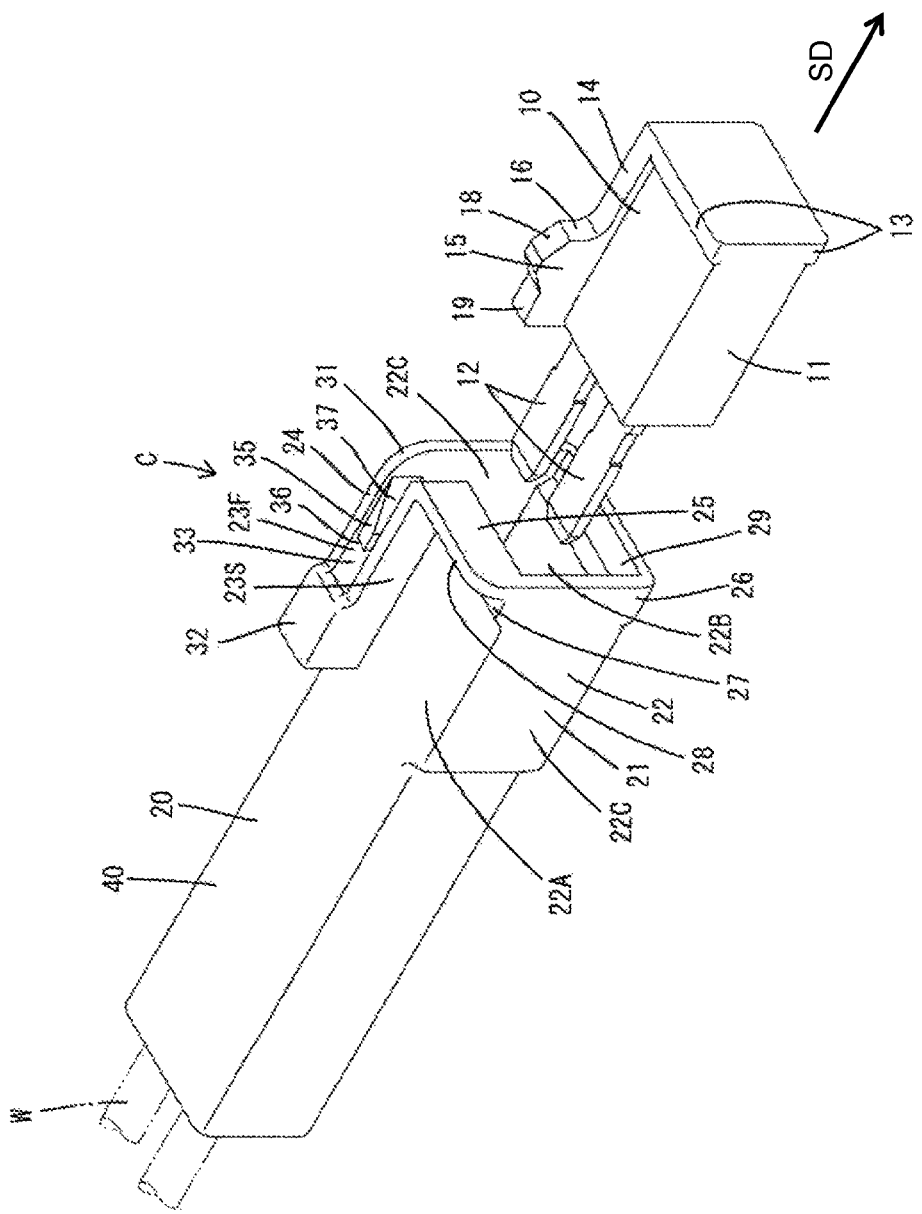
FIG. 1 is a perspective view of a connector in an embodiment showing a state before a fitting-side component and a receiving-side component are fitted.

A connector C in this embodiment is a small-size connector with a built-in large-capacity chip diode (not shown) and is used to provide a rectifying action. The connector C includes a fitting-side component 10 in which the chip diode is built and a receiving-side component 20 to which the fitting-side component 10 is to be fit. In the following description, in each constituent member, a front side in a connecting direction to a mating side is referred to as a front side, and an opposite side thereof (separating direction) is referred to as a rear side. Specifically, a left upper side of FIG. 1 is a front side and a right lower side is a rear side in the fitting-side component 10 and a right lower side of FIG. 1 is a front side and a left upper side is a rear side in the receiving-side component 20. Further, upper and lower sides of FIG. 1 are referred to as upper and lower sides.

The fitting-side component 10 includes a main body 11 for sealing the chip diode with resin and one or more connection terminals 12 connected to the chip diode. The connection terminals 12 project forward from the main body 11.

Figure 2:
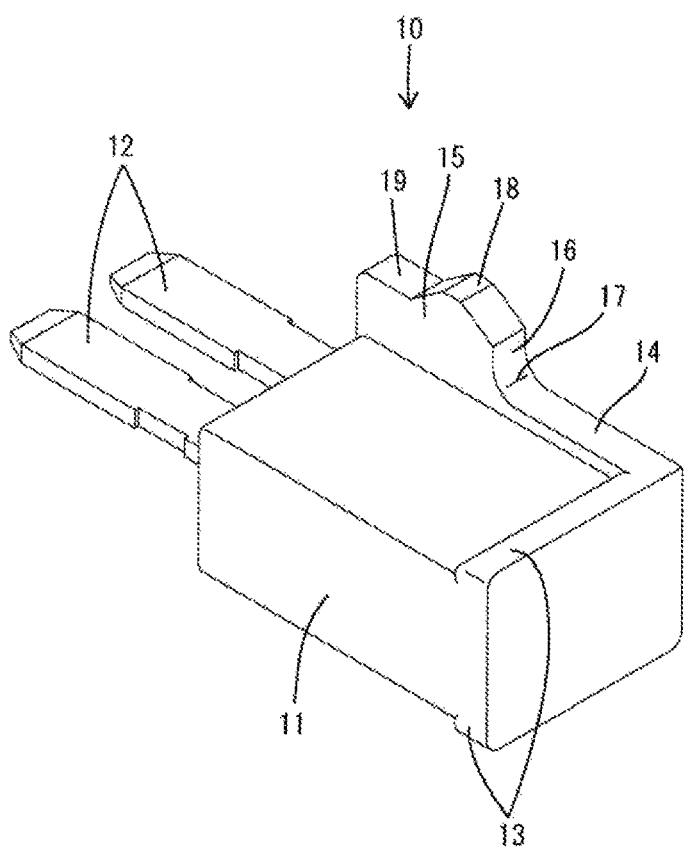
FIG. 2 is a perspective view showing the fitting-side component.
Figure 3:
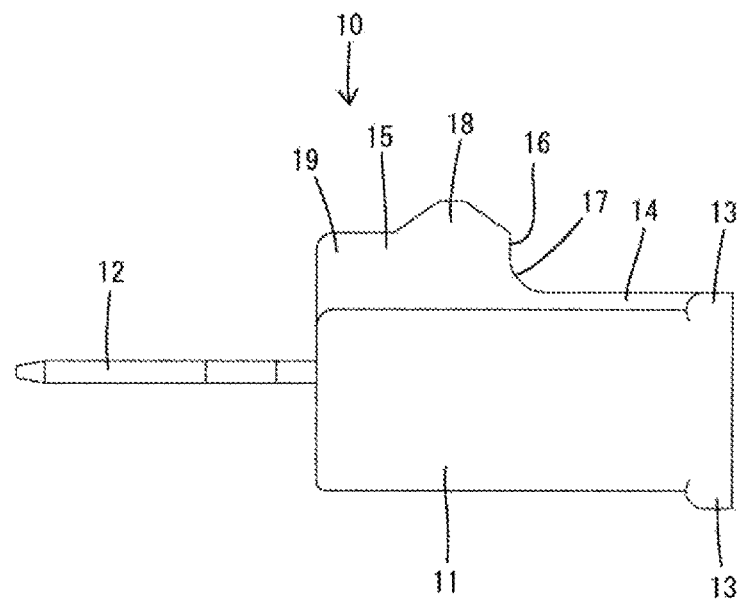
FIG. 3 is a side view showing the fitting-side component.
Figure 4:
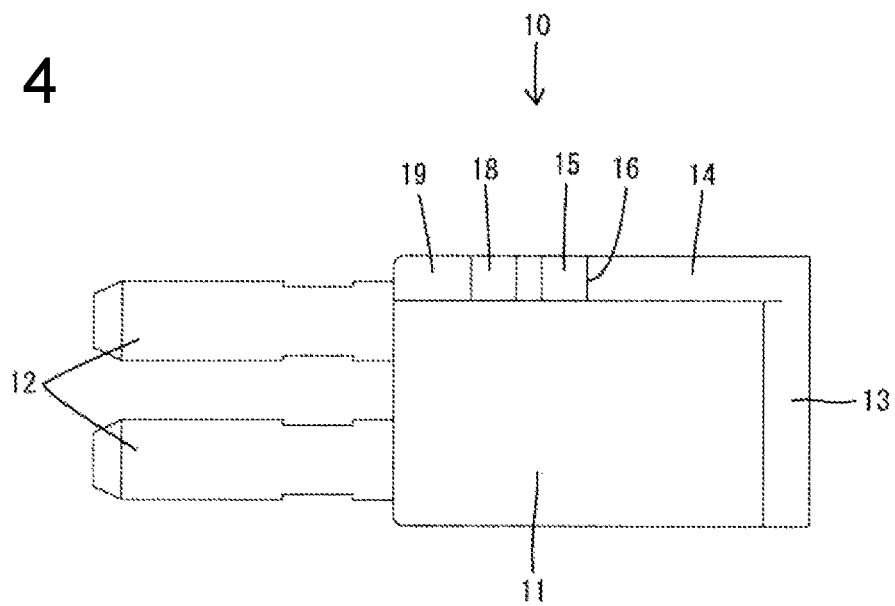
FIG. 4 is a plan view showing the fitting-side component.
Figure 5:
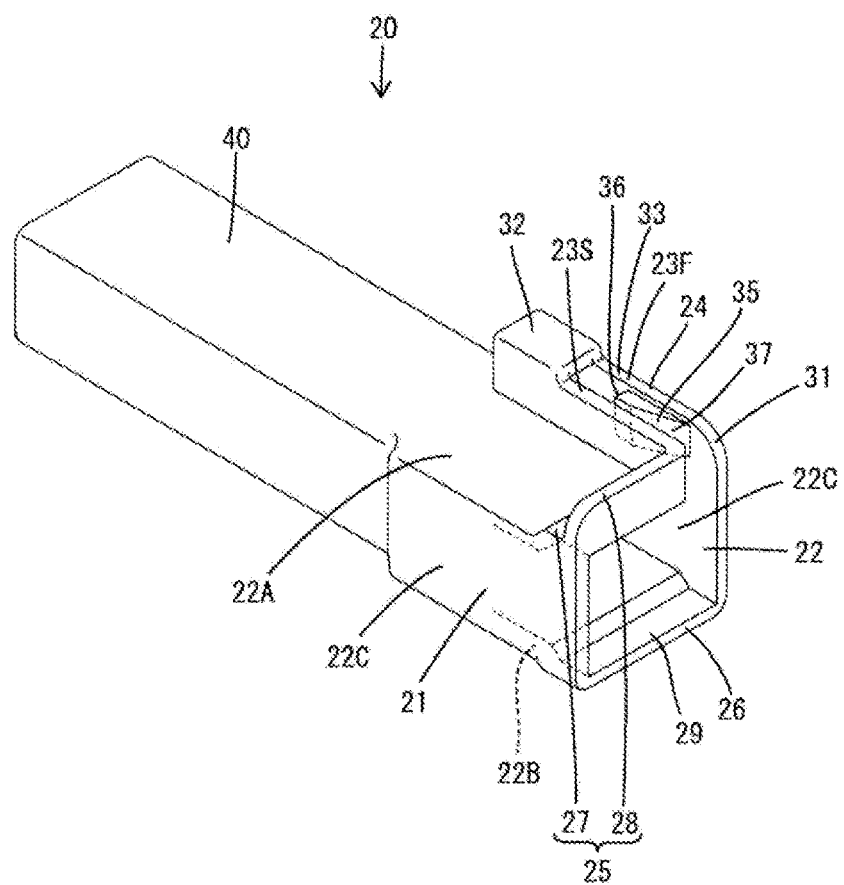
FIG. 5 is a perspective view showing the receiving-side component.

As shown in FIGS. 2 to 4, the main body 11 substantially has a rectangular or polygonal parallelepiped shape as a whole. The main body 11 includes first steps 13 projecting out along rear end edges and at least one second step 14 projecting out along a side edge.

The first steps 13 are provided on both upper and lower surfaces of the main body 11 and respectively project up from the upper surface of the main body 11 and down from the lower surface. The first steps 13 are formed over the entire width of the main body 11. The first steps 13 provided on the upper and lower surfaces of the main body 11 have substantially the same projecting dimensions.

The second step 14 is provided only on the upper surface side of the main body 11 and projects up from the upper surface of the main body 11. The second step 14 is provided on a rear part of the main body 11 and is linked to the first step 13 on the upper surface of the main body 11. The first and second steps 13, 14 have substantially the same projecting dimensions.

A lock 15 stands on the upper surface of the main body 11 and defines a wall standing along a side edge of the main body 11. The lock 15 is provided on a front part (substantially half) of the main body 11 and extends from the front end of the main body 11 to the front end of the second step 14. The lock 15 is continuous with the second step 14. The lock 15 and the second step 14 have equal widths.

A locking surface 16 is formed on the rear surface of the lock 15 (surface facing an opening end of a receptacle 21 in a fitted state of the fitting-side component 10 and the receiving-side component 20) and stands substantially at a right angle to a separating direction from the receiving-side component 20. Note that a part between the locking surface 16 and the second step 14 is formed into a roundly curved rounded portion 17.

The lock 15 includes a protrusion 18 projecting farther up than the locking surface 16. The protrusion 18 has a chevron shape when viewed laterally and both front and rear surfaces are inclined at the same gradient as shown in FIG. 3. A projecting end surface of the protrusion 18 is substantially parallel (horizontal) to a front-back direction. Note that a front part 19 of the lock 15 before the protrusion 18 has the same height as the locking surface 16.

The receiving-side component 20 is made e.g. of synthetic resin and includes the forwardly open receptacle 21 that fits externally to the fitting-side component 10, and a terminal accommodating portion 40 for accommodating terminal fittings T connected to end parts of wires W.

Cavities 41 are provided in the terminal accommodating portion 40. The terminal fitting T connected to the end part of the wire W is inserted into each cavity 41 from an inserting side (particularly from behind) and locked and retained by a locking lance 42. A front wall 43 of the terminal accommodating portion 40 is formed with through holes 44 through which the connection terminals 12 of the fitting-side component 10 are to be inserted.

The receptacle 21 includes a main body fitting portion 22 shaped to extend along the outer surfaces of the main body 11 and a lock receiving portion 24 having a first wall 23F and a second wall 23S) configured to extend along outer surfaces of the lock 15 and arranged to face each other.

The main body fitting portion 22 is a rectangular tube with an upper wall 22A configured to extend along the upper surface of the main body 11, a lower wall 22B configured to extend along the lower surface of the main body 11 and a pair of side walls 22C configured to extend along the both left and right surfaces of the main body 11.

Figure 8:
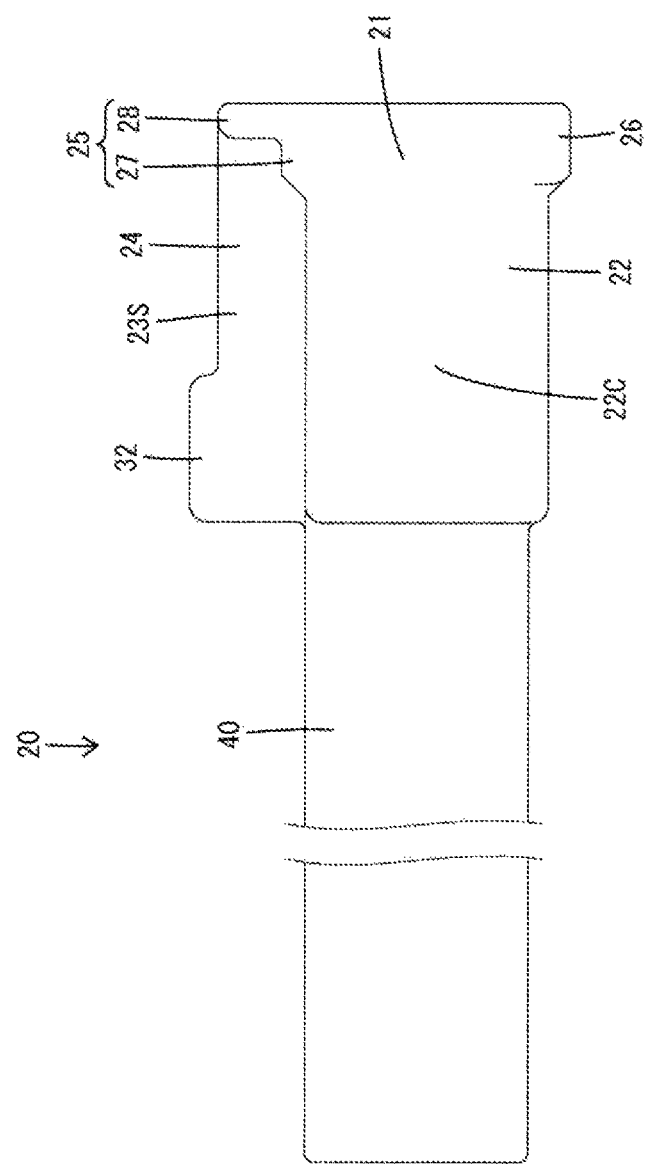
FIG. 8 is a side view showing the receiving-side component.
Figure 9:
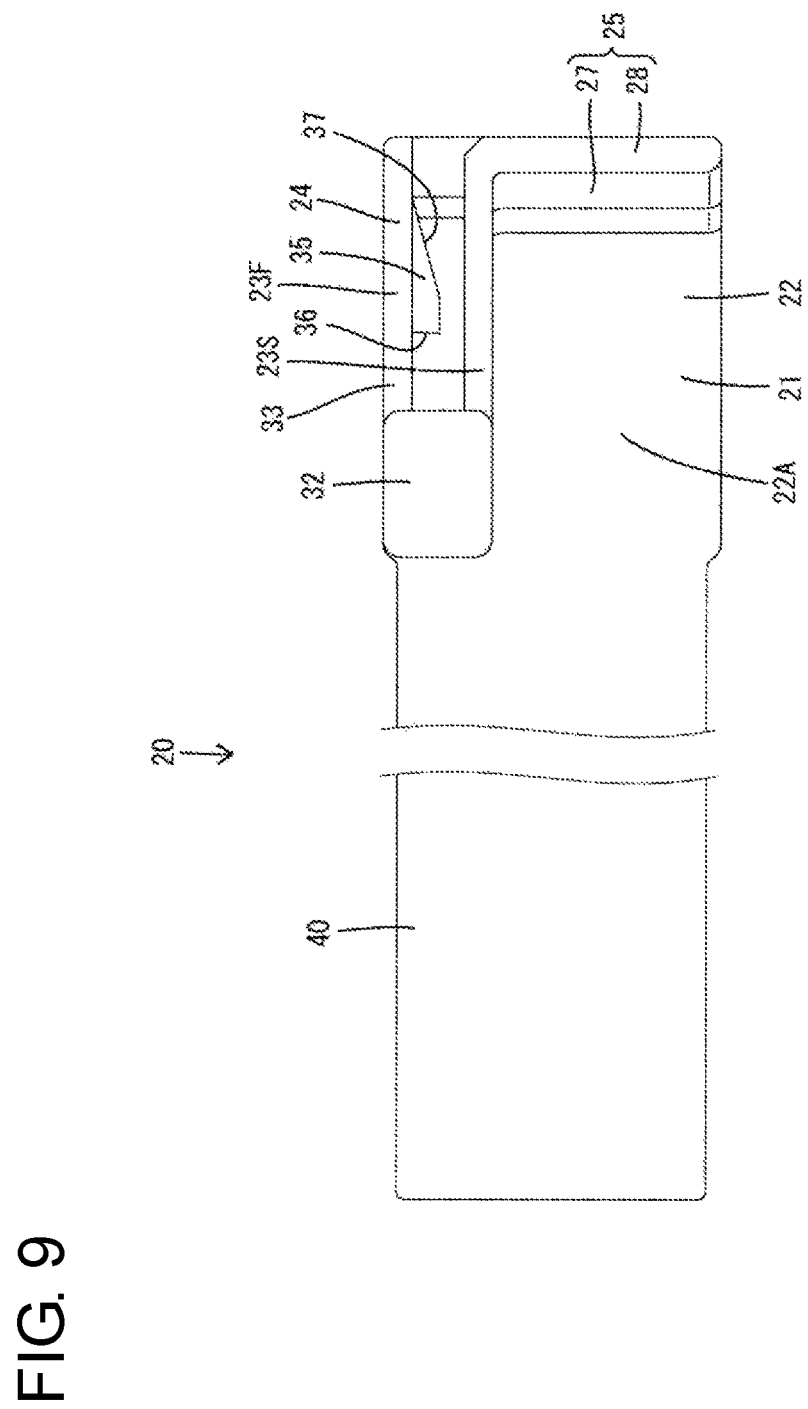
FIG. 9 is a plan view showing the receiving-side component.

As shown in FIG. 8, the receptacle 21 includes a first reinforcing portion 25 provided on the upper surface of the main body fitting portion 22 and a second reinforcing portion 26 provided on the lower surface. The first and second reinforcing portions 25, 26 stand out along the opening end of the receptacle 21.

The first reinforcing portion 25 includes a base 27 projecting up from the upper surface of the main body fitting portion 22 and a standing portion 28 standing on the upper surface of the base 27. The standing portion 28 has a smaller dimension in the front-back direction than the base 27 and is provided along the front end of the base 27. The first reinforcing portion 25 is formed over the entire width of the receptacle 21 except at the lock receiving portion 24, and one end thereof is linked to the second wall 23S of the lock receiving portion 24 (see FIG. 9).

The second reinforcing portion 26 projects slightly down on the lower surface of the main body fitting portion 22. The second reinforcing portion 26 is formed over the entire width of the receptacle 21. A projecting dimension and a dimension in the front-back direction of the second reinforcing portion 26 are equal to those of the base 27 of the first reinforcing portion 25. A recess 29 is formed inside (above) the second reinforcing portion 26 of the receptacle 21 (see FIG. 13). The first step 13 located on the lower side of the main body portion 11 is insertable into the recess 29.

The first and second walls 23F, 23S of the lock receiving portion 24 are provided over the entire length of the receptacle 21. The first and second walls 23F, 23S face each other while being spaced apart by a distance equal to a width of the lock 15. Heights of the first and second walls 23F, 23S are equal to that of the first reinforcing portion 25 (see FIG. 8). A space between the first and second walls 23F, 23S entirely communicates with an internal space of the receptacle 21.

The lock receiving portion 24 stands along the side of the receptacle 21. The first wall 23F extends along the side of the receptacle 21 and the second wall 23S is at an inner side (central side in a width direction of the receptacle 21) while extending substantially parallel to the first wall 23F.

Figure 7:
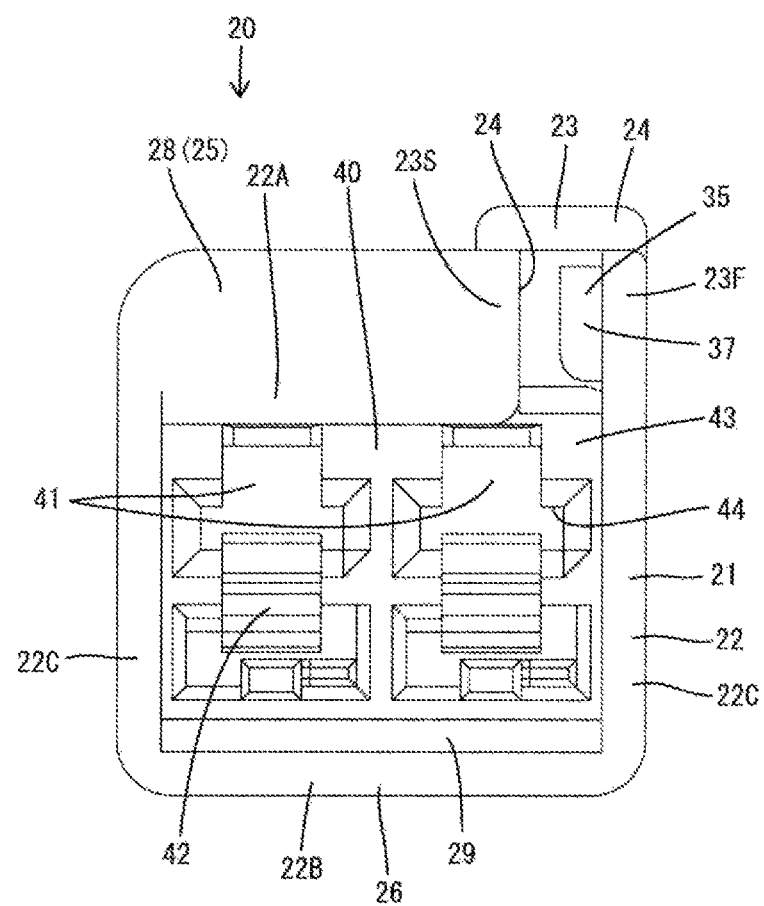
FIG. 7 is a front view showing the receiving-side component.

The first wall 23F has the same thickness as the side wall 22C of the receptacle 21 (see FIG. 7). An upper corner part of the front end of the first wall 23F is formed into an arcuate portion 31 having an arc shape (see FIG. 13). The second wall 23S is substantially at a right angle to the upper wall 22A of the main body fitting portion 22.

The lock receiving portion 24 has a bridge 32 that bridges between upper ends of the first and second walls 23F, 23S at a rear end part of the lock receiving portion 24. An upper part of the rear end of the lock receiving portion 24 is substantially rectangular in a top view by due to the bridge 32. A part of the lock receiving portion 24 before the bridge 32 defines an opening 33 through which the space between the first and second walls 23F, 23S is open upward.

Figure 6:
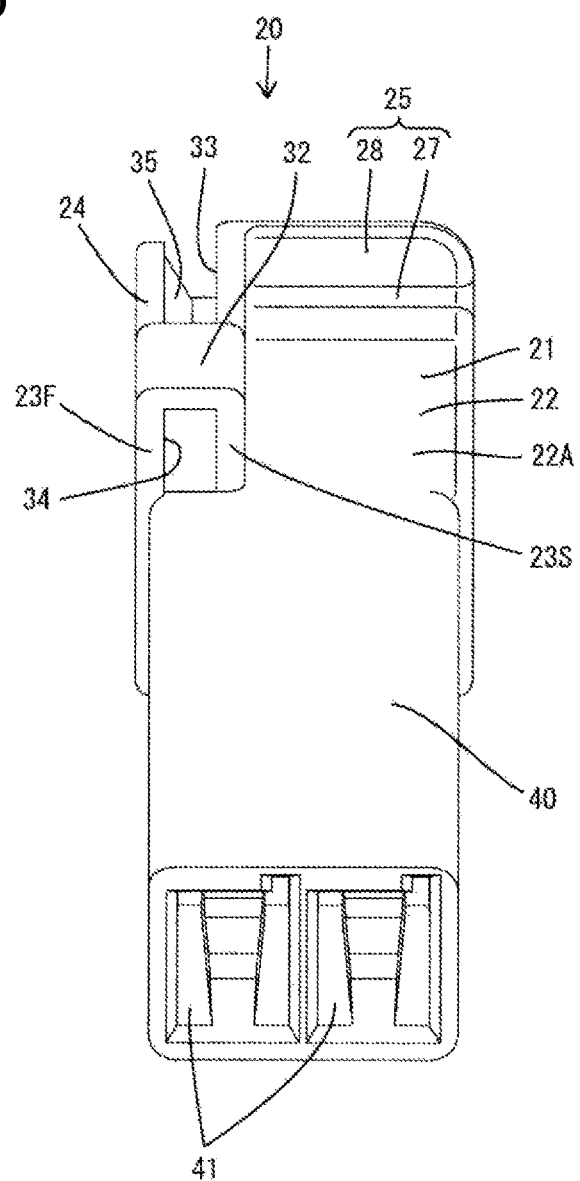
FIG. 6 is a perspective view showing the receiving-side component when viewed obliquely from an upper rear side.

The lock receiving portion 24 has an opening 34 through which a jig is insertable into a space between the first and second walls 23F, 23S (see FIG. 6). The opening 34 is surrounded by the first and second walls 23F, 23S and the bridge 32. The opening 34 is provided on the rear end of the lock receiving portion 24 and allows the space between the first and second walls 23F, 23S to be open backward.

Figure 13:
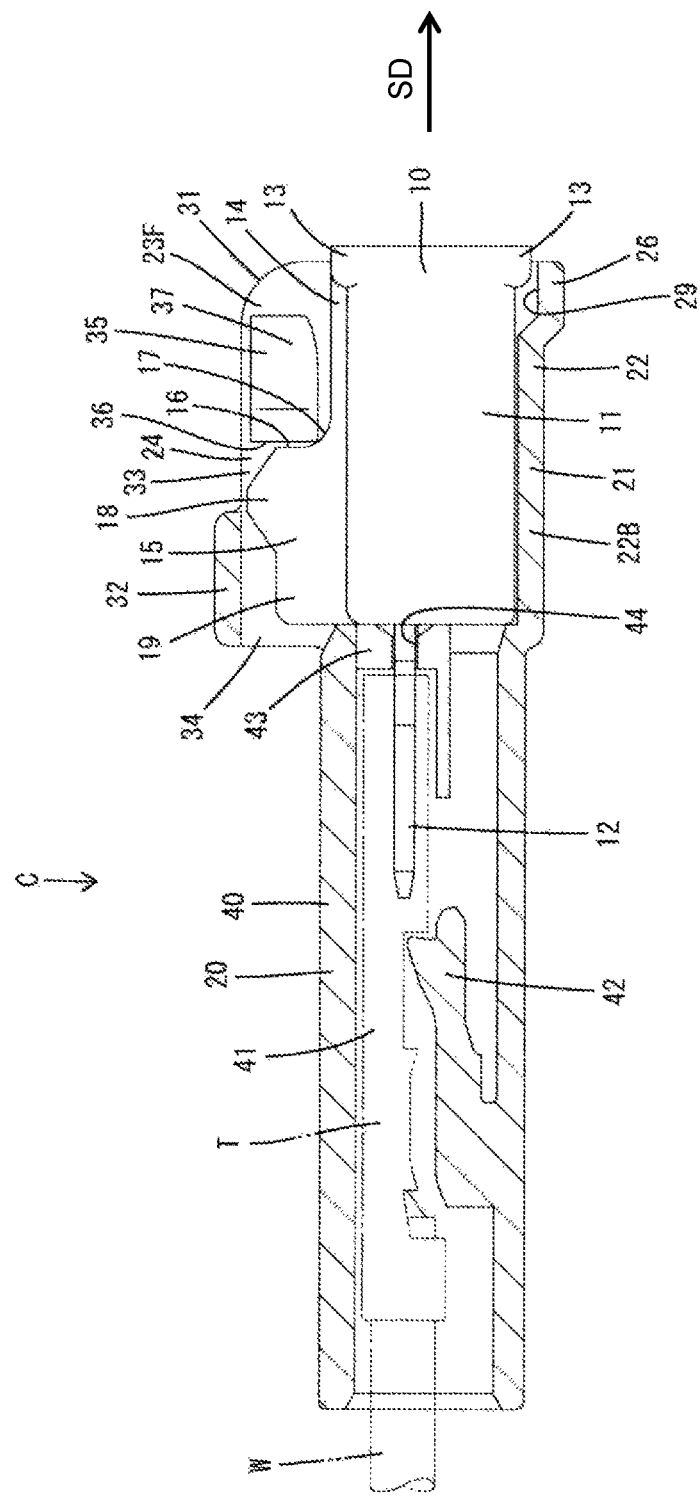
FIG. 13 is a section, corresponding to a cross-section at a position A-A of FIG. 11, showing the connector in the state where the fitting-side component and the receiving-side component are fitted.

As shown in FIG. 13, a lock projection 35 projects on the inner surface of the lock receiving portion 24, and specifically on the surface of the first wall 23F facing the second wall 23S. The lock projection 35 is shaped to extend in the front-back direction and the front end is located on the rear end of the arcuate portion 31. A vertical dimension of the lock projection 35 is equal to a height of the lock portion 15 including the protrusion 18. Note that a corner part of the projecting end from the first wall portion 23F out of a lower end part of the lock projection 35 round substantially entirely in the front-back direction.

Figure 12:
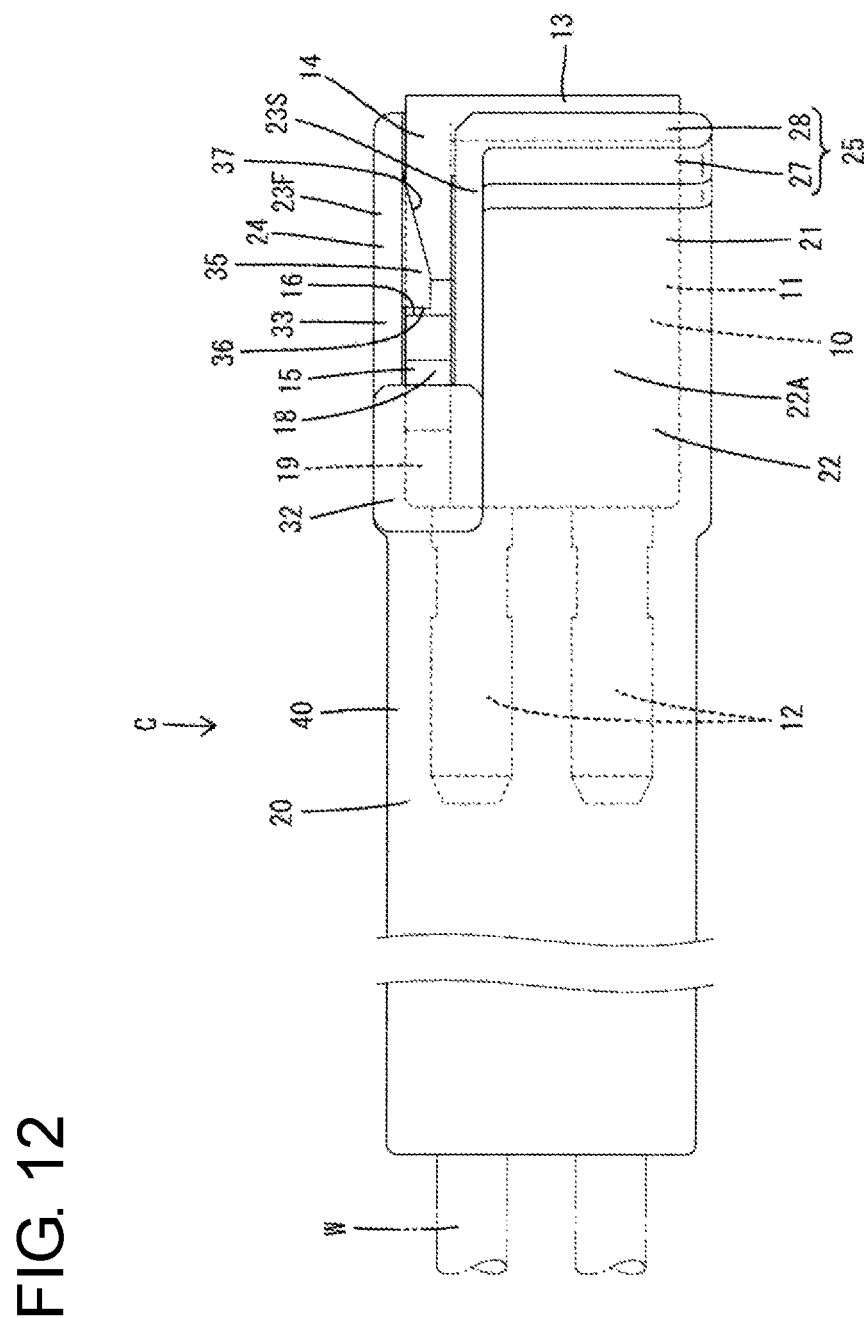
FIG. 12 is a plan view showing the connector in the state where the fitting-side component and the receiving-side component are fit together

As shown in FIG. 12, the rear surface (surface on the side of the opening portion 33) of the lock projection 35 is formed into a lock receiving surface 36 to be locked to the locking surface 16 of the lock 15. The lock receiving surface 36 extends substantially at a right angle to the front-back direction (separating direction SD of the fitting-side component 10) and is substantially perpendicular to a surface of the first wall 23F. The lock receiving surface 36 is formed on the entire rear surface of the lock projection 35.

The front (surface facing the opening side of the receptacle 21) of the lock projection 35 is an inclined surface 37 with a projecting distance that gradually increases from the opening end (front) to the back end (rear) of the receptacle 21. The inclined surface 37 has a moderate inclination up to a position close to the rear end of the lock 35. Note that a projecting end surface of the lock projection 35 is substantially parallel to the surface of the first wall 23F.

Next, examples of connecting and separating operations of the connector C in this embodiment are described.

In connecting the connector C, the fitting-side component 10 is fit into the receiving-side component 20 with the connection terminals 12 facing forward. Then, the main body 11 of the fitting-side component 10 is inserted into the receptacle 21 and the front 19 of the lock 15 contacts the inclined surface 37 of the lock projection 35. As the fitting-side component 10 is pushed further, the first wall 23F gradually opens outward. When the lock 15 moves over the lock projection 35, the first wall 23F resiliently returns inward and the lock receiving surface 36 of the lock projection 35 faces the locking surface 16 of the lock 15 at a proximate position. In this way, the lock receiving surface 36 of the lock projection 35 is locked to the locking surface 16 of the lock 15 and the connector C is held in a connected state to complete the connecting operation.

Figure 10:
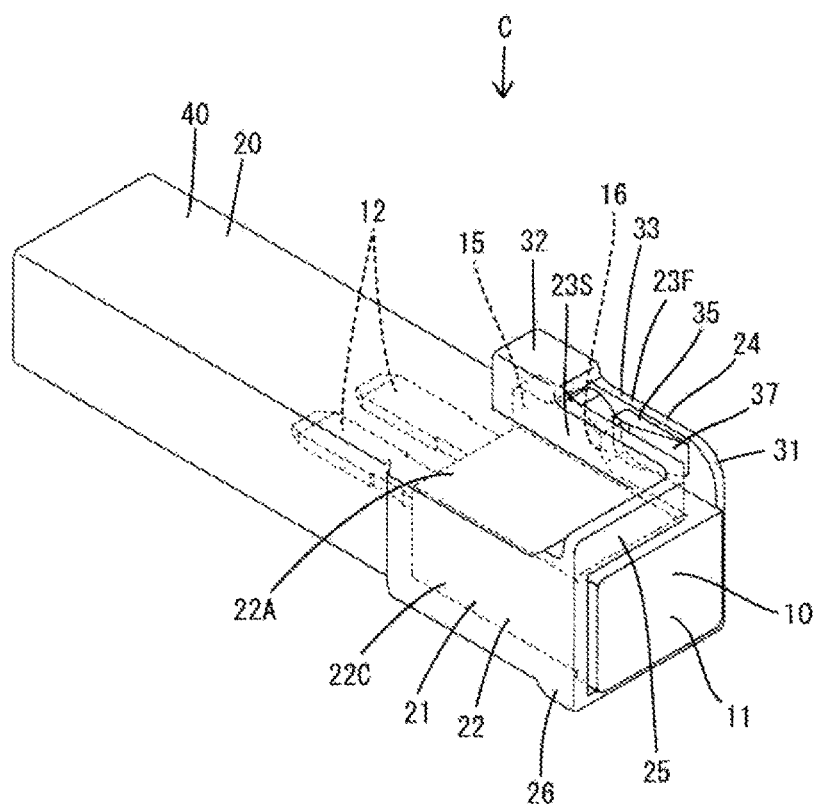
FIG. 10 is a perspective view showing the connector in a state where the fitting-side component and the receiving-side component are fit together
Figure 11:
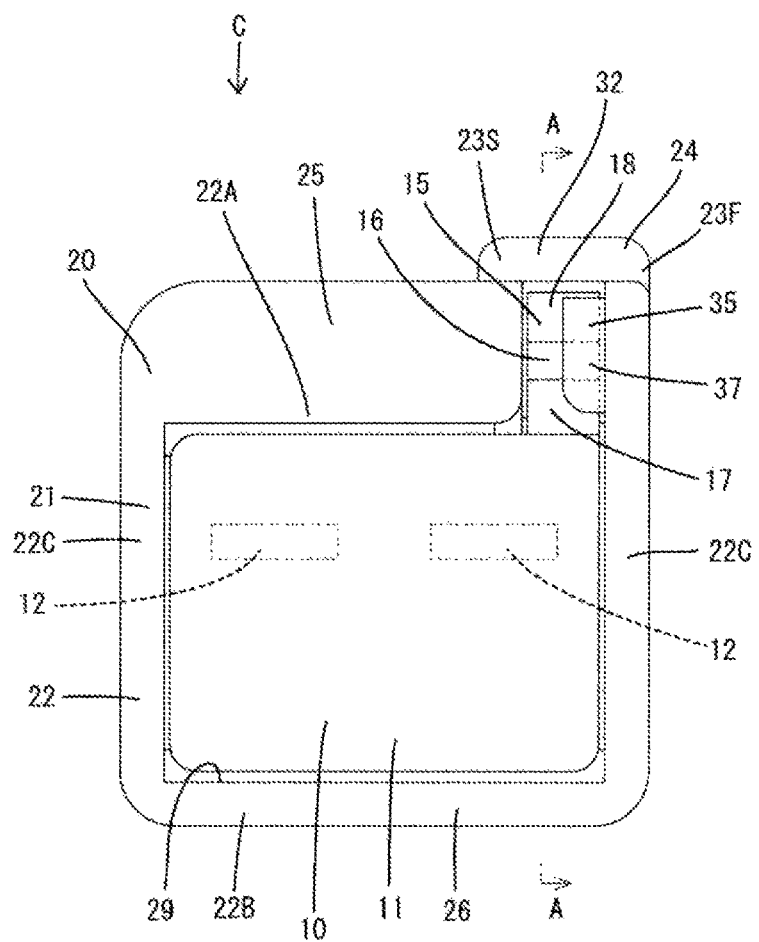
FIG. 11 is a front view showing the connector in the state where the fitting-side component and the receiving-side component are fit together.

In the connected state of the connector C, the main body 11 of the fitting-side component 10 is fit substantially entirely in the receptacle 21 and the connection terminals 12 project into the terminal accommodating portion 40, as shown in FIG. 10. At this time, the front portion 19 of the lock 15 and the front inclined surface of the protrusion 18 are located below the bridge 32 and the second step 14 is located between the walls 23F, 23S. Further, the entire lock 15 is facing backward through the opening 34 of the lock receiving portion 24.

In separating the connector C, the jig is inserted through the opening 34 of the lock receiving portion 24. At this time, the tip of the jig is guided into the space between the first and second walls 23F, 23S by the bridge 32, and thus the tip of the jig can be inserted easily to a proper position of the space between the first and second walls 23F, 23S. Locking between the locking surface 16 of the lock 15 and the lock receiving surface 36 of the lock projection 35 is released and the fitting-side component 10 is detached by pushing the lock 15 forward while pushing the first wall 23F out by the tip of the jig inserted into the inside of the lock receiving portion 24. In the above way, the separating operation of the connector C is completed.

Next, functions and effects of the embodiment configured as described above are described.

The connector C of this embodiment is configured so that the fitting-side component 10 is fit into the receiving-side component 20. The fitting-side component 10 includes the block-shaped main body 11 and the lock 15 standing on the outer surface of the main body 11, and the receiving-side component 20 includes the receptacle 21 open forward and externally fittable to the fitting-side component 10. The locking surface 16 is provided on the rear surface of the lock 15 (surface facing the opening of the receptacle 21 in the fitted state of the fitting-side component 10 and the receiving-side component 20) and projects at a substantially right angle to the separating direction SD from the receiving-side component 20. Additionally, the receiving-side component 20 includes the lock projection 35 projecting on the inner surface of the receptacle 21 for locking the locking surface 16 from the opening side of the receptacle 21.

The lock projection 35 is difficult to displace. Thus, the locked state of the lock projection 35 and the locking surface 16 is not released easily. Thus, a holding force of the receiving-side component 20 for holding the fitting-side component 10 in the fitted state can be enhanced.

Further, the receptacle 21 includes the main body fitting portion 22 shaped to extend along the outer surfaces of the main body 11. Additionally, the lock receiving portion 24 has the walls 23F, 23S configured to extend along the outer surfaces of the lock 15 and arranged to face each other, and the lock projection 35 projects on the inner surface of the lock receiving portion 24. The receptacle 21 is shaped to conform with the outer shape of the fitting-side component 10. Thus, the receiving-side component 20 can have a compact shape. Further, since the lock projection 35 is present on the inner surface of the lock receiving portion 24, a size reduction is possible as compared to the case where the lock projection 35 projects on the outer surface.

The lock receiving portion 24 includes the bridge that 32 bridges between the two walls 23F, 23S. Since the opening deformation of the walls 23F, 23S is less likely to occur according to this configuration, the locked state of the locking surface 16 and the lock receiving portion 24 can be held more reliably. Further, the entrance of external matters (wire, small-size terminal, etc.) into the space between the pair of wall portions 23F, 23S can be prevented by the bridge 32.

Further, the lock receiving portion 24 has the opening 34 through which the jig is insertable into between the pair of walls 23F, 23S. According to this configuration, the fitting-side component 10 can be detached from the receiving-side component 20 by inserting the jig into between the two walls 23F, 23S through the opening 34 and releasing locking between the lock 15 and the lock projection 35.

The front surface (surface facing the opening side of the receptacle 21) of the lock projection 35 is formed into the inclined surface 37 whose projecting distance gradually increases from the opening side toward the back side. Since the lock 15 of the fitting-side component 10 easily moves over the lock projection 35 according to this configuration, the operation of fitting the fitting-side component 10 into the receiving-side component 20 can be performed easily. Further, the receiving-side component 20 includes the first and second reinforcing portions 25, 26 provided along the opening of the receptacle 21. Since the receptacle 21 is difficult to deform according to this configuration, the holding force of the receiving-side component 20 for holding the fitting-side component 10 in the fitting state can be enhanced further.

The invention is not limited to the above described and illustrated embodiment. For example, the following embodiments also are included in the scope of the invention.

The invention is applied to the connector C with the built-in diode in the above embodiment, but the invention can be applied to various connectors.

The lock projection 35 is provided on the first wall 23F in the above embodiment. However, it may be provided on the second wall.

The receptacle 21 includes the main body fitting portion 22 shaped to extend along the outer surfaces of the main body 11 and/or the lock receiving portion 24 having the pair of walls 23F, 23S configured to extend substantially along the outer surfaces of the lock 15 and/or arranged to face each other in the above embodiment. However, there is no limitation to this and the receptacle may be, for example, in the form of a rectangular tube capable of accommodating the entire fitting-side component including the lock inside.

The lock receiving portion 24 includes the bridge that bridges between the walls 23F, 23S in the above embodiment, but the bridge may be omitted.

The bridge 32 bridges between the upper ends of the walls 23F, 23S in the above embodiment. However, there is no limitation to this, and, for example, a bridge may bridge between any part of the walls, such as between the rear ends of a pair of walls.

The lock receiving portion 24 is provided with the opening 34, through which the jig is insertable into between the pair of walls 23F, 23S, in the above embodiment. However, the opening need not necessarily be provided.

The receiving-side component 20 includes the first and second reinforcing portions 25, 26 provided along the opening of the receptacle 21 in the above embodiment. However, the reinforcing portions may not be provided or only one of them may be provided.

The lock 15 is provided on the upper surface of the main body 11 in the above embodiment. However, the lock may be provided on the lower surface or either one of the left and right surfaces of the main body.

The lock 15 is provided along the side edge of the main body 11 in the above embodiment. However, there is no limitation to this, and the lock may be, for example, provided in a widthwise central part of the main body.

REFERENCE SIGNS

C . . . connector
10 . . . fitting-side component
11 . . . main body
15 . . . lock
16 . . . locking surface
20 . . . receiving-side component
21 . . . receptacle
22 . . . main body fitting portion
23F, 23S . . . pair of wall portions
24 . . . lock receiving portion
25 . . . first reinforcing portion (reinforcing portion)
26 . . . second reinforcing portion (reinforcing portion)
32 . . . bridging portion
34 . . . opening
35 . . . lock projection
37 . . . inclined surface

What is claimed is:

1. A connector, comprising:
   a receiving-side component including a forwardly open receptacle and a lock receiving portion having first and second spaced apart walls projecting from an outer surface of the receiving-side component, each of the first and second walls having inner surfaces facing each other, and at least one lock projection projecting on one of the inner surfaces of the first and second walls and facing the other of the first and second side walls; and
   a fitting side component including a main body fittable into the receptacle in a fitting direction and at least one lock portion standing on an outer surface of the main body and configured to be inserted into the lock receiving portion in the connection direction, a locking surface formed on the lock and facing a separating direction opposite the connecting direction, the locking surface engaging the at least one lock projection to lock the fitting side component to the receiving side component.

2. The connector of claim 1, wherein the lock receiving portion includes a bridge bridging between the two walls.

3. The connector of claim 1, wherein a surface of the lock projection substantially facing the opening side of the receptacle at least partly is formed into an inclined surface whose projecting distance gradually increases from the opening side toward a back side.

4. The connector of claim 1, wherein the receiving-side component includes at least one reinforcing portion at least partly provided along an opening of the receptacle.

5. The connector of claim 1, wherein the fitting-side component comprises a built-in large-capacity chip diode to provide a rectifying action.

6. The connector of claim 1, wherein the lock receiving portion has an opening through which a jig is insertable into an inner space of the receiving-side component and between the two walls.

7. The connector of claim 2, wherein the bridge is configured so that the jig inserted through the opening is guided by the bridge into a space between the two walls.

* * * * *